United States Patent [19]

Ng et al.

[11] Patent Number: 4,613,891
[45] Date of Patent: Sep. 23, 1986

[54] PACKAGING MICROMINIATURE DEVICES

[75] Inventors: Kwok K. Ng, Union; Simon M. Sze, Berkeley Heights, both of N.J.

[73] Assignee: AT&T Bell Laboratories, Murray Hill, N.J.

[21] Appl. No.: 581,259

[22] Filed: Feb. 17, 1984

[51] Int. Cl.[4] .................. H01L 23/48; H01L 29/44; H01L 29/52
[52] U.S. Cl. ........................ 357/68; 357/40; 357/49; 357/55; 357/69; 357/70; 357/71; 357/80; 361/404; 174/52 FP
[58] Field of Search .............. 357/49, 55, 80, 68, 357/69, 71, 70, 40, 45; 174/52 FP; 361/404

[56] References Cited

U.S. PATENT DOCUMENTS

| | | | |
|---|---|---|---|
| 2,890,395 | 6/1959 | Lathrop et al. | 357/69 |
| 3,255,511 | 6/1966 | Weissenstern et al. | 357/51 |
| 3,397,278 | 8/1968 | Pomerantz | 357/40 |
| 3,493,820 | 2/1970 | Rosvold | 357/69 |
| 3,648,131 | 3/1972 | Stuby | 357/40 |
| 4,023,197 | 5/1977 | Magdo et al. | 357/52 |
| 4,246,595 | 1/1981 | Noyori et al. | 357/71 |
| 4,257,061 | 3/1981 | Chapel, Jr. et al. | 357/69 |
| 4,286,374 | 9/1981 | Hantusch | 357/51 |

OTHER PUBLICATIONS

Bodendorf et al., "Active Silicon Chip Carrier," *IBM Tech. Discl. Bull.*, vol. 15, No. 2, Jul. 1972, pp. 656 and 657.
Magdo, "Pyramid Shaped Elec. Feedthrough in Si Wafers," *IBM Tech. Discl. Bull.*, vol. 19, No. 4, Sep. 1976, pp. 1232-1233.
"Wafer-Chip Assembly for Large-Scale Integration," *IEEE Transactions on Electron Devices*, vol. ED-15, No. 9, P. Kraynak et al, Sep. 1968, pp. 660-663.

*Primary Examiner*—Martin H. Edlow
*Assistant Examiner*—E. Fallick
*Attorney, Agent, or Firm*—Lucian C. Canepa

[57] ABSTRACT

One or more silicon-integrated-circuit chips are attached, active side up, to the bottom side of a silicon wafer. A sloped-wall through-aperture is etched in the wafer in registry with a portion of the active side of each attached chip. A lithographically defined conductive pattern is then formed on the top side of the wafer and on the sloped walls to connect conductive pads on each chip to conductive pads on other chips and/or to conductive terminals disposed along the periphery of the wafer. The resulting packaged chip assembly has advantageous performance and cost characteristics.

6 Claims, 10 Drawing Figures

PACKAGING MICROMINIATURE DEVICES

BACKGROUND OF THE INVENTION

This invention relates to packaging microminiature devices and, more particularly, to a packaging assembly and a method in which one or more devices are affixed to and interconnected on a wafer.

Conventional integrated-circuit chip interconnection techniques involve the use of wire bonds between peripherally disposed pads on the chip and an associated lead frame that includes rigid terminal members. In turn, the lead frame is mounted in a chip package. The rigid terminals of one or more such packaged chips are then inserted into corresponding apertures in a ceramic board or card that contains a thin-film interconnection pattern.

An alternative packaging technique for achieving a very-high-density interconnection of active silicon-integrated-circuit devices without the use of wire bonds has been heretofore proposed. The alternative is directed at permitting the fabrication of large electronic subsystems in essentially monolithic form, as described, for example, in "Wafer-Chip Assembly for Large-Scale Integration," *IEEE Transactions on Electron Devices,* Vol. ED-15, No. 9, September 1968, pp. 660–663.

In the assembly described in the aforecited article, chips are face-down bonded onto a silicon wafer that contains interconnect lines. The same lithographic technology is used on the wafer as on the chips to obtain a very-high-packing density and a relatively low-inductance assembly. The face-down bonding permits access to each chip at points other than the periphery of the chip, thereby requiring only a relatively small part of the overall chip area for interconnect lines.

In the face-down bonding operation, conductive pads on each chip are bonded to corresponding pads included in the interconnect pattern on the wafer. To form such bonds between each chip and the wafer, a metallic bump is typically formed on the chip, or on the wafer, or on both. In practice, however, lack of uniformity in bump height and relatively poor long-term stability characteristics of the bump technology make this bonding approach unattractive for many high-reliability applications of practical importance. Moreover, the area required for the bumps on mating contact pads on the chip and wafer is extremely large relative to the micron and submicron dimensions that are becoming increasingly the goal of much integrated circuit design work.

In another known approach, flowable solder balls are utilized in a face-down bonding technique to form connections between chip and wafer pads. In practice, this approach tends to minimize the aforementioned problem of lack of uniformity in bump height. But this approach does not generally satisfy the goal of achieving extremely small-area connections between the chip and wafer pads.

For the aforestated reasons, workers in the art have continued their efforts directed at trying to further improve the packaging of integrated-circuit devices. It was recognized that these efforts, if successful, had the potential for significantly decreasing the cost and increasing the performance characteristics of such devices.

SUMMARY OF THE INVENTION

Hence, an object of the present invention is to improve the packaging of integrated-circuit devices. More specifically, an object of this invention is an improved packaging assembly for mounting and effecting electrical connections to integrated-circuit devices and to a method for fabricating such an assembly.

Briefly, these and other objects of the present invention are realized in a specific illustrative assembly and to a fabrication method in which at least one microminiature device is mounted on the bottom side of a wafer. Conductive pads are located in a central portion of the top surface of the mounted device. The wafer is then patterned to form a sloped-wall through-aperture in registry with the central portion, and thus with the conductive pads, of each mounted device. Subsequently, by utilizing standard integrated-circuit fabrication techniques, a conductive pattern is formed overlying the top side of the wafer and on the sloped walls to connect the conductive pads of each device to other devices and/or to conductive terminals on the top side of the wafer near the periphery thereof. The wafer-size assembly thus made is further processed (for example, encapsulated) in conventional ways and is then available as a monolithic component for inclusion in an electronic system.

BRIEF DESCRIPTION OF THE DRAWING

A complete understanding of the present invention and of the above and other features thereof may be gained from a consideration of the following detailed description presented hereinbleow in connection with the accompanying drawing, in which.

DETAILED DESCRIPTION

Figure 1:
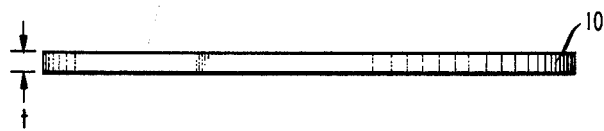
FIGS. 1 through 10 are schematic representations, not drawn to scale, of portions of a specific illustrative assembly made in accordance with the principles of the present invention.

FIG. 1 shows a wafer 10 that constitutes an integral part of an assembly made in accordance with the principles of the present invention. Advantageously, the wafer 10 is made of monocrystalline silicon and is cut in the form of a disc about 75-to-150 millimeters in diameter, with a thickness t of approximately 0.5 millimeters. In accordance with an advantageous feature of this invention, the top and bottom surfaces of the wafer 10 are parallel and lie in (100) crystalline planes of the silicon structure. The reason for selecting this particular orientation will be evident later below when a preferential etching step included in the fabrication sequence for the assembly is described.

Figure 2:
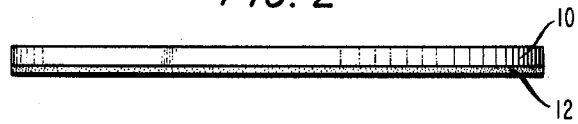

Illustratively, an etch-resistant layer 12 shown in FIG. 2 is deposited on the entire bottom surface of the wafer 10. By way of example, the layer 12 comprises silicon nitride deposited to a thickness of approximately 1000 Angstrom units.

Figure 3:
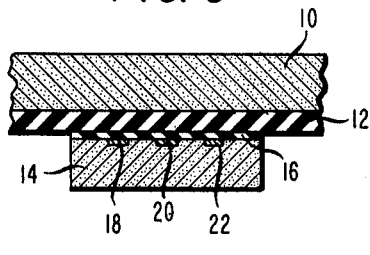

FIG. 3 shows in enlarged form a portion of the aforedescribed wafer 10 and layer 12. Additionally, FIG. 3 depicts a microminiature device, for example, a silicon-integrated-circuit chip 14, adhered to the bottom of the layer 12 by means of a bonding layer 16. By way of example, the layer 16 comprises an adhesive material such as a conventional layer of silicon dioxide or a standard polyimide material. Illustratively, the layer 16 is spun on the top surface of the chip 14 to a thickness of about 0.1-to-10 micrometers before the chip 14 is placed in contact with the layer 12.

In accordance with the principles of the present invention, one or more microminiature devices such as the chip 14 are adhered to the underside of the wafer 10 depicted in FIG. 3. The chip 14 is, for example, about 0.25-to-0.75 millimeters thick and includes a square top surface about six millimeters on a side. In some applications of applicants' invention, as many as 100 devices of various designs and types are mounted on the underside of the wafer 10.

The top of the chip 14 shown in FIG. 3 constitutes the so-called active side thereof. Included on the active side of the chip are standard elements such as transistors (not shown), alignment marks (not shown), etc. Also included thereon are multiple relatively small-area conductive pads. Three such pads 18, 20 and 22 located in a central region of the active side of the chip are schematically depicted in FIG. 3. Each pad has, for example, a square top surface area only about 2.5-to-10 micrometers on a side.

Importantly, the small-area pads included on the chip 14 can be located anywhere within the central region of the top surface. In other words, the pads are not limited to being located along the periphery of the central region. Thus, as indicated in FIG. 3, some of the pads can be located in or towards the middle of the central region. This is advantageous because it reduces the total lead length required on the chip. As a result, the losses and delays experienced by signals that are propagated from the chip to associated circuitry are reduced. Moreover, the combination of reduced lead length and small-area pads leaves more of the active area available for other elements. Consequently, denser integrated circuit designs are thereby made feasible.

In accordance with a feature of applicants' invention, a well-defined through-aperture with four sloped walls is formed in the wafer in registry with the central region of each mounted device such as the chip 14. Advantageously, the apertures are formed in a particular wet etching step in which the wafer 10 is inherently preferentially etched to reveal (111) planes that constitute the desired sloped walls. Thus, as indicated in FIG. 4 by reference lines 24 and 26, each wall to be formed in the wafer 10 will be inclined at an angle of 35 degrees with respect to vertical walls through the wafer.

The bottom or smaller opening of each sloped-wall through-aperture in the wafer 10 is designed to overlie only the central region of an associated chip. In that way, a peripheral band of the chip that does not include conductive pads remains adhered to the underside of the wafer. In specific embodiments, the width w (FIG. 4) of this band is, for example, about 10-to-250 micrometers. Of course, this band need not be continuous or closed or uniform in width.

Figure 4:
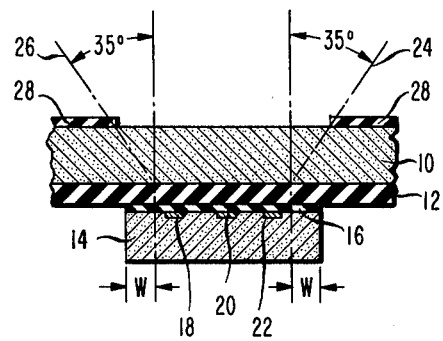

Advantageously, the through-aperture whose outline is represented in FIG. 4 is formed by selectively masking the top surface of the wafer 10 and then exposing the wafer to a wet etchant such as a solution of potassium hydroxide. A suitable etch-resistant mask for such an etchant is made, for example, of silicon nitride. A layer 28 of silicon nitride patterned by conventional lithographic techniques is shown in FIG. 4. Illustratively, the layer 28 is approximately 2000 Angstrom units thick.

An advantageous etchant for forming the aforedescribed through-aperture in the wafer 10 comprises approximately 250 grams of potassium hydroxide dissolved in 0.8 liters of water and 0.2 liters of propanol. Etching for about 3-to-10 hours with such a solution is effective to form the desired sloped-wall aperture(s) in the herein-specified wafer 10. Subsequently, the top silicon nitride masking layer 28 and that portion of the bottom silicon nitride layer 12 directly underlying the smaller opening of the aperture can be removed by, for example, etching the structure in hot phosphoric acid, as is well known in the art.

Figure 5:
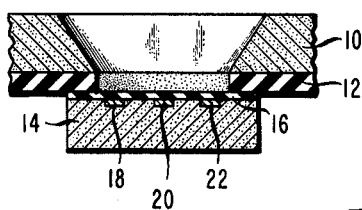
Figure 6:
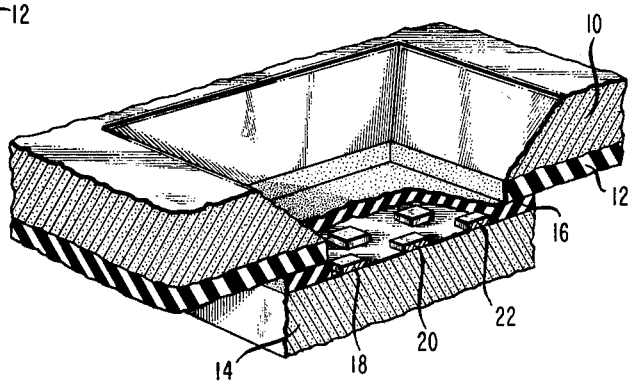

At that point in the fabrication sequence, an assembly made in accordance with applicants' invention appears as depicted in FIGS. 5 and 6. In the perspective view of FIG. 6, the adhesive layer 16 is partially broken away to show some of the small-area conductive pads included on the chip 14. These include the previously specified pads 18, 20 and 22.

The entire exposed portion of the adhesive layer 16 shown in FIG. 6 may be removed by utilizing a standard etchant therefor. Alternatively, it may be advantageous to leave the layer 16 substantially intact and to subsequently etch only small-area openings therethrough in registry with associated underlying conductive pads on the chip 14. In the further fabrication steps described below, this latter alternative approach will be specified.

Figure 7:
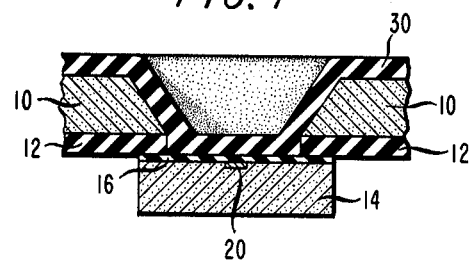

As indicated in FIG. 7, the next step in applicants' inventive fabrication sequence is to form an insulating layer 30 over the entire top surface of the depicted assembly. Illustratively, the layer 30 comprises a deposited layer of silicon dioxide about one micrometer thick.

So as to not unduly clutter the drawing, only one conductive pad 20 on the chip 14 is explicitly shown in FIG. 7. It should be understood, however, that in accordance with applicants' invention as many as 1000, or even more, small-area pads may be actually included on some chips.

Etching of the layer 30 is then carried out in a standard fashion utilizing conventional integrated-circuit patterning techniques to provide an opening in the layer 30 in registry with the conductive pad 20. Either in the same step in which the layer 30 is etched or in a subsequent etching step, a corresponding opening is also formed in the adhesive layer 16. In that way, the top surface of the conductive pad 20 is exposed, as indicated in FIG. 8.

Figure 8:
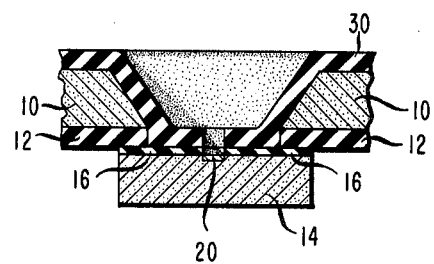

Next, a conductive layer approximately one micrometer thick made, for example, of aluminum is deposited over the entire top surface of the assembly shown in FIG. 8. The conductive layer is then patterned by conformal lithographic techniques (utilizing, for example, a germanium selenide resist) to form fine-line runners that extend from the chip pads, up one or more of the sloping walls of the aperture associated with each chip and onto the main top surface of the assembly. In turn, these runners extend to other mounted chips and/or to relatively large-area pads disposed around the periphery of the chip-wafer assembly.

Figure 9:
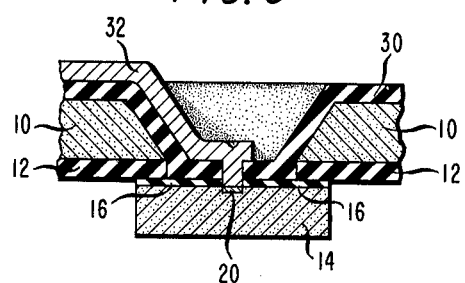

A single conductive runner 32 is represented in FIG. 9. The runner 32 contacts the pad 20 on the chip 14 and extends up one sloped wall of the depicted aperture to overlie the silicon dioxide layer 30 that constitutes the main top surface of the depicted assembly.

In accordance with applicants' invention, additional alternating insulating and conductive layers (not shown) may be deposited on top of the assembly represented in FIG. 9. In that way, multi-level conductive patterns may be formed in the assembly. In some embodiments, it is advantageous to form one or more of the conductive levels as large-area planar conductors. Such planar conductors may be utilized, for example, as low-resistance low-inductance ground and/or power planes.

Figure 10:
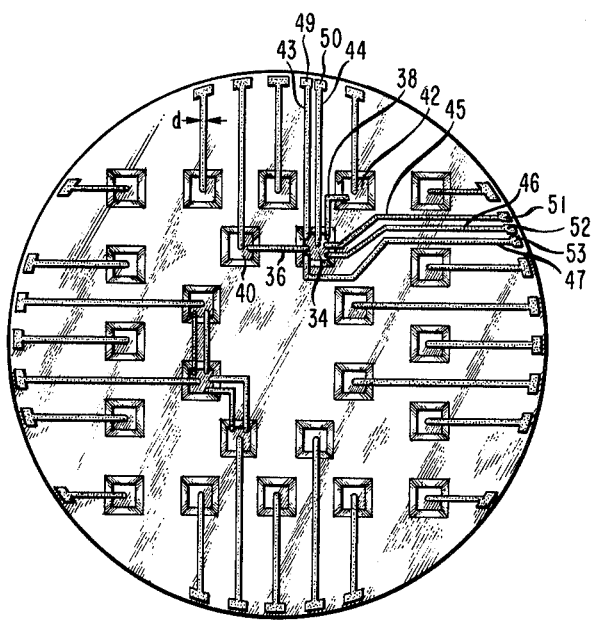

FIG. 10 is a top schematic view of a portion of an assembly made in accordance with the principles of the present invention. (A suitable standard encapsulant for the assembly may be advantageous but is not shown in FIG. 10.) For representative purposes only, twenty-four chips are indicated as being included in the depicted assembly. (In a 150-millimeter wafer, it is feasible to include as many as 500 mounted chips.) In practice, each such chip typically has multiple (for example, 100 or more) leads extending therefrom. So as not to unduly clutter FIG. 10, however, each mounted chip is shown in this simplified depiction as including at least one but not more than seven leads.

Thus, for example, mounted chip 34 in FIG. 10 is represented as having seven leads connected thereto. Leads 36 and 38 of the chip 34 respectively extend to adjacent chips 40 and 42. Additionally, leads 43 through 47 respectively extend between the chip 34 and peripheral conductive pads 49 through 53.

In one specific illustrative embodiment of applicants' invention, each of the interconnecting leads shown in FIG. 10 has a width d of approximately 1-to-10 micrometers. By way of example, each of the peripheral pads shown therein is about 1.25-by-1.25 millimeters. By a variety of conventional techniques, it is a relatively easy matter to establish electrical connections between such large-area peripheral pads and similar assemblies and/or other components included in an overall electronic system.

It is noted that this application is being filed concurrently with a related commonly assigned application designated K. K. Ng-S. M. Sze application Ser. No. 581,336, filed Feb. 17, 1984. In one embodiment described in the related application, devices such as chips containing contact pads are mounted, active side up, on the top surface of a wafer. At least one sloped wall is then formed on each such mounted chip. A conductive pattern, including runners extending down the sloped wall(s), is then formed to connect the pads to other chip pads and/or to peripherally disposed conductive elements on the wafer.

Finally, it is to be understood that the above-described structures and processing techniques are only illustrative of the principles of the present invention. In accordance with these principles, numerous modifications and alternatives may be devised by those skilled in the art without departing from the spirit and scope of the invention. For example, it is feasible to fabricate composite chip-wafer assemblies that embody both the concepts described herein and those described in the aforecited related application. In such a composite assembly, sloped-wall chips and straight-wall chips would be mounted on both sides of a wafer that contains sloped-wall through apertures.

Also, it is to be understood that the wafer 10 may in some cases of practical importance be made of a material other than silicon. In selecting an alternative material, factors such as matching the thermal properties of the wafer to those of the associated chips and the amenability of the wafer to being preferentially etched are to be considered. But, of course, it is to be realized that techniques other than etching may be employed to form the aforespecified through-apertures. The slope of the walls of these apertures is not critical. The sloped walls merely serve to facilitate the formation of runners thereon. Preferential etching, as described above, is one convenient and advantageous way of achieving such sloped-wall apertures.

It is noted that assemblies related to those disclosed herein are described in two commonly assigned copending U.S. applications. These related applications are designated Ser. No. 582,079, filed Feb. 21, 1984 and Ser. No. 581,260, filed Feb. 17, 1984. Additionally, commonly assigned copending U.S. application Ser. No. 581,258, filed Feb. 17, 1984 contains subject matter related to that disclosed herein.

The aforeidentified Blahut application discloses a system organization in which multiple semiconductor chips are formed in or attached to a semiconductor wafer. Illustratively, the assemblies described herein are suited for being organized and implemented in the particular manner described in the Blahut application.

More specifically, the Blahut application describes a carrier (wafer) with a plurality of component circuits (chips) being formed therein or attached thereto with the circuits being coupled together via a signal conduit path. Illustratively, the carrier and at least some of the circuits are of the same material. Each of the component circuits is adapted to have a priority with respect to the transmission of information onto the signal conduit path. A plurality of arbitration conduit paths exists. Each of the component circuits, except for possibly the component circuit having the lowest priority, comprises a separate one of a plurality of arbitration request circuits. Each arbitration request circuit is coupled to a separate one of the arbitration conduit paths and is adapted to selectively allow a signal from its component circuit to reach the arbitration conduit path coupled thereo. Each of the component circuits, except for possibly the component circuit having a highest priority, comprises a separate one of a plurality of arbitration circuits. Each arbitration circuit is coupled to at least one of the arbitration conduit paths and is adapted to detect which of any of the other component circuits having a higher priority is requesting access to the signal conduit path and to enable its component circuit to gain access to the signal conduit path if its component circuit is requesting access to the signal conduit path and if its component circuit has a higher priority than any other component circuit which is requesting such access.

What is claimed is:

1. An assembly comprising
   a wafer having planar top and bottom surfaces, said wafer having conductive terminal portions along the periphery thereof overlying said top surface,
   at least one microminiature device mounted on the bottom surface of said wafer, said device including in a central portion of its top surface conductive pads facing said wafer,
   a sloped-wall aperture formed through said wafer in registry with the central portion of each mounted device,
   and a conductive pattern connecting the pads of a mounted device to said terminal portions, said pattern being disposed on at least one of the sloped walls associated with a mounted device and overlying the planar top surface of said wafer, wherein said wafer and each of said devices comprises monocrystalline silicon.

2. An assembly as in claim 1 wherein the top and bottom surfaces of said wafer constitute or are parallel to (100) surfaces of the silicon structure.

3. An assembly as in claim 2 wherein the sloped walls of each aperture constitute (111) planes of the silicon structure.

4. An assembly as in claim 3 wherein the instrumentality mounting each device on the bottom surface of said wafer comprises an adhesive layer disposed around at least a peripheral portion of the top surface of each device.

5. An assembly comprising a self-supporting wafer,
at least one microminiature device including conductive pads in a central region of one surface of said device,
means mounting said at least one device directly on said self-supporting wafer,
at least one sloped wall extending from the central region of said at least one mounted device to one surface of said wafer,
and a conductive pattern, including peripherally disposed elements, on the one surface of said wafer and on said at least one sloped wall to connect said pads to other device pads and/or to said elements,
wherein said wafer and each device comprise monocrystalline silicon.

6. An integrated circuit assemblage comprising
a plurality of semiconductive chips, each having a plurality of conductive pads on a top surface for providing electrical connections to circuit elements in the chip,
means for supporting electrical interconnection of the chips comprising a self-supporting cap member to one surface of which is directly bonded separately the top surface of each of the plurality of chips, the self-supporting cap member including sloped-wall apertures to permit access to the conductive pads,
and means forming conductive paths overlying an opposite surface of the self-supporting cap member and extending along the sloped walls of the apertures for contacting the conductive pads and interconnecting the chips,
wherein said cap member and each of said chips comprise monocrystalline silicon.

* * * * *